US012809209B2

(12) United States Patent
Yajima et al.

(10) Patent No.: US 12,809,209 B2
(45) Date of Patent: Nov. 24, 2026

(54) BACKLIGHT AND DISPLAY APPARATUS

(71) Applicant: Magnolia White Corporation, Tokyo (JP)

(72) Inventors: Toshihiro Yajima, Tokyo (JP); Takashi Ota, Tokyo (JP); Michihide Shibata, Tokyo (JP)

(73) Assignee: MAGNOLIA WHITE CORPORATION, Tokyo (JP)

( * ) Notice: Subject to any disclaimer, the term of this patent is extended or adjusted under 35 U.S.C. 154(b) by 379 days.

(21) Appl. No.: 18/422,043

(22) Filed: Jan. 25, 2024

(65) Prior Publication Data

US 2024/0255799 A1 Aug. 1, 2024

(30) Foreign Application Priority Data

Jan. 27, 2023 (JP) ................................ 2023-011095

(51) Int. Cl.
*G02F 1/13357* (2006.01)
*H10H 20/851* (2025.01)
*H10W 90/00* (2026.01)

(52) U.S. Cl.
CPC ... *G02F 1/133603* (2013.01); *H10H 20/8513* (2025.01); *H10W 90/00* (2026.01)

(58) Field of Classification Search
CPC ........ G02F 1/133603; G02F 1/133614; H10H 20/8513; H10W 90/00
See application file for complete search history.

(56) References Cited

U.S. PATENT DOCUMENTS

2010/0315320 A1 12/2010 Yoshida
2016/0377786 A1* 12/2016 Ham .................... G02B 6/0055 349/65
2018/0341151 A1 11/2018 Kurita
2022/0187660 A1 6/2022 Nagatani
2024/0248347 A1* 7/2024 Tsai .................. G02F 1/133606

FOREIGN PATENT DOCUMENTS

CN 213149428 U 5/2021
JP 2009-158462 A 7/2009
JP 2017139073 A * 8/2017
JP 2018-198187 A 12/2018
WO 2020203053 A1 10/2020

OTHER PUBLICATIONS

Notice of Reasons Refusal issued Mar. 3, 2026, in corresponding Japanese Patent Application No. 2023-011095, 9pp.

* cited by examiner

*Primary Examiner* — J.E. Schoenholtz
(74) *Attorney, Agent, or Firm* — XSENSUS LLP

(57) ABSTRACT

The present invention has been made to reduce a yellow shift around blue LEDs in a backlight including the blue LEDs and a color conversion sheet. Provided is a backlight including a light source including blue LEDs arranged in a matrix, on a plane, at first intervals, and a color conversion sheet arranged to cover the light source, in which red quantum dots that emit red light in response to blue light and green quantum dots that emit green light in response to blue light are dispersed in the color conversion sheet, short-wavelength LEDs that emit light of a shorter wavelength than that of blue light are arranged near the blue LEDs, and blue quantum dots that emit blue light in response to the short-wavelength light are arranged in the color conversion sheet, at positions overlapping the short-wavelength LEDs in plan view.

11 Claims, 9 Drawing Sheets

BACKLIGHT AND DISPLAY APPARATUS

CROSS-REFERENCE TO RELATED APPLICATION

The present application claims priority from Japanese Patent Application JP 2023-011095 filed on Jan. 27, 2023, the content of which is hereby incorporated by reference into this application.

BACKGROUND OF THE INVENTION

1. Field of the Invention

The present invention relates to a direct-type backlight including a large number of light emitting diodes (LEDs) arranged on a plane and to a display apparatus including the backlight.

2. Description of the Related Art

A backlight including a large number of single-color LEDs arranged on a plane and including a color conversion sheet arranged to cover the LEDs, to thereby obtain white light, is often used as a backlight of a display region of a liquid crystal display apparatus or the like. The following illustrates an example of the liquid crystal display apparatus.

The liquid crystal display apparatus includes a thin film transistor (TFT) substrate provided with pixel electrodes, TFTs, etc., formed in a matrix and includes a counter substrate arranged to face the TFT substrate. A liquid crystal layer is placed between the TFT substrate and the counter substrate. An image is formed by controlling, pixel by pixel, the light transmittance of liquid crystal molecules.

A liquid crystal display panel does not emit light, and a backlight is necessary. The luminance can be large in direct-type LEDs including LEDs arranged on a plane. The LEDs emit light at a specific wavelength. Meanwhile, the backlight requires white light. Thus, there is a system for mixing rays of light emitted from LEDs of three colors to obtain white light and a system for using a light conversion sheet to convert the light from LEDs of one color into white light. In either system, there is a challenge of completely mixing the rays of light to obtain white light.

In the configuration described in Japanese Patent Laid-Open No. 2018-198187, a large number of single-color LEDs are arranged on a plane. For each LED, a quantum dot (QD) sheet is provided on an inner wall, and a QD box including an opening for emitting light upward is arranged. In the configuration of Japanese Patent Laid-Open No. 2018-198187, the QD sheet converts the light from the LED, and the light from the LED and the converted light are sufficiently mixed in the QD box to emit white light from the opening.

SUMMARY OF THE INVENTION

A method for using single-color LEDs to obtain white light through a color conversion sheet is often used as means for obtaining white color in the backlight owing to the relatively simple structure. For example, white light can artificially be obtained by mixing blue light and yellow light. Thus, when a color conversion sheet for converting blue light into yellow light is arranged in the emission direction of a blue LED, white light obtained by mixing the blue light and the yellow light is emitted from the color conversion sheet.

The method has a problem that the proportions of the blue light and the yellow light may vary location by location, and color unevenness easily occurs even when white light is desired to be displayed. In Japanese Patent Laid-Open No. 2018-198187, the QD box is arranged for each LED to emit, from the opening of the QD box, white light obtained by sufficiently mixing rays of light of a plurality of wavelengths. However, the structure of the method is relatively complicated.

An object of the present invention is to use single-color LEDs and a color conversion sheet with a relatively simple configuration to obtain white backlight in which color unevenness is unlikely to occur.

The present invention solves the problem, and main specific means is as follows.

(1) A backlight including a light source including blue LEDs arranged in a matrix, on a plane, at first intervals, and a color conversion sheet arranged to cover the light source, in which red quantum dots that emit red light in response to blue light and green quantum dots that emit green light in response to blue light are dispersed in the color conversion sheet, short-wavelength LEDs that emit light of a shorter wavelength than that of blue light are arranged near the blue LEDs, and blue quantum dots that emit blue light in response to the short-wavelength light are arranged in the color conversion sheet, at positions overlapping the short-wavelength LEDs in plan view.

(2) A backlight including a light source including blue LEDs arranged in a matrix, on a plane, at first intervals, and a color conversion sheet arranged to cover the light source, in which red quantum dots that emit red light in response to blue light and green quantum dots that emit green light in response to blue light are dispersed in the color conversion sheet, and the color conversion sheet includes regions in a ring shape around the blue LEDs in plan view, where a proportion of the green quantum dots is higher than those in other regions.

DETAILED DESCRIPTION OF THE PREFERRED EMBODIMENTS

A backlight according to the present invention can be used for various display apparatuses. A liquid crystal display apparatus is a typical one of the display apparatuses with backlights, and the present invention will be described with a focus on the liquid crystal display apparatus.

Figure 1:
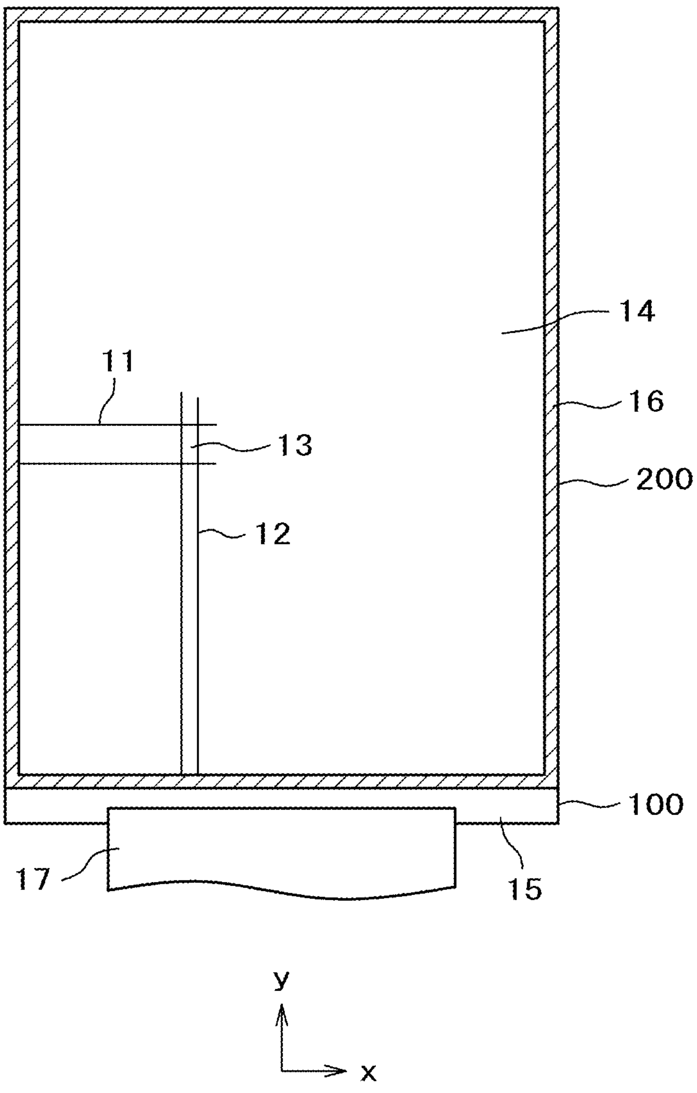
FIG. 1 is a plan view of a liquid crystal display apparatus.

FIG. 1 is a plan view illustrating an example of the liquid crystal display apparatus. In FIG. 1, a TFT substrate 100 and a counter substrate 200 are attached by a sealant 16, and liquid crystal is sandwiched inside. A display region 14 is formed at a part where the TFT substrate 100 and the counter substrate 200 overlap. In the display region 14, scan lines 11 are extended in a horizontal direction (x direction) and arrayed in a vertical direction (y direction). Video signal lines 12 are extended in the vertical direction and arrayed in the horizontal direction. Pixels 13 are formed in regions surrounded by the scan lines 11 and the video signal lines 12.

In FIG. 1, a part where the TFT substrate 100 does not overlap the counter substrate 200 is a terminal region 15. A flexible wiring substrate 17 for supplying power or a signal to a liquid crystal display panel is connected to the terminal region 15. A driver integrated circuit (IC) that drives the liquid crystal display panel is mounted on the flexible wiring substrate 17. A backlight is arranged on the back surface of a TFT as illustrated in FIG. 2.

Figure 2:
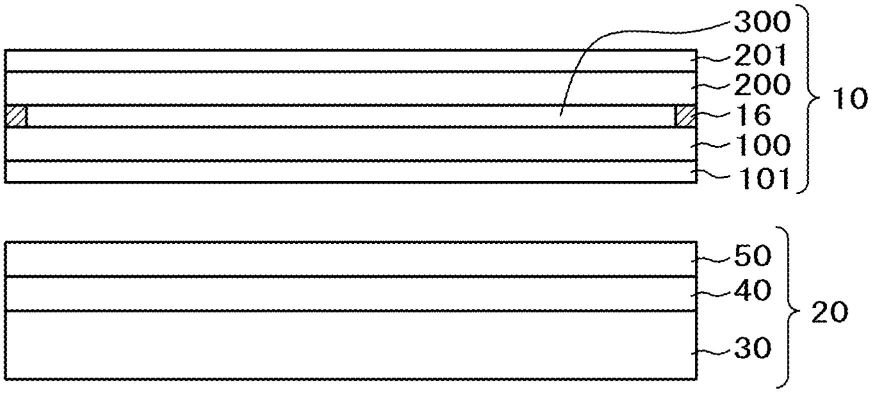
FIG. 2 is a cross-sectional view of the liquid crystal display apparatus.

FIG. 2 is a cross-sectional view of the liquid crystal display apparatus. In FIG. 2, a backlight 20 is arranged on the back surface of a liquid crystal display panel 10. The configuration of the liquid crystal display panel 10 is as follows. The counter substrate 200 provided with a black matrix and a color filter is arranged to face the TFT substrate 100 provided with pixel electrodes, common electrodes, TFTs, scan lines, video signal lines, etc. The TFT substrate 100 and the counter substrate 200 are attached by the sealant 16 at the periphery, and liquid crystal 300 is enclosed inside.

Liquid crystal molecules are initially oriented by orientation films formed on the TFT substrate 100 and the counter substrate 200. Once a voltage is applied between the pixel electrodes and the common electrodes, the liquid crystal molecules rotate, and the light from the backlight 20 is controlled pixel by pixel to form an image. The liquid crystal 300 can control only polarized light, and thus, a lower polarizing plate 101 is arranged below the TFT substrate 100 to allow only the polarized light to enter the liquid crystal 300. The light modulated by the liquid crystal 300 is analyzed by an upper polarizing plate 201, and the image is visually recognized.

In FIG. 2, the backlight 20 is arranged on the back surface of the liquid crystal display panel 10. The backlight 20 includes a color conversion sheet 40 arranged on a light source unit 30 and includes an optical sheet group 50 arranged on the color conversion sheet 40.

Examples of the type of backlight 20 of the display apparatus include a side light type and a direct type. In the side light type, a light source, such as an LED, is arranged on a side surface of a light guide plate. In the direct type, a light source, such as an LED, is arranged on a lower surface of a light guide plate. The backlight of the direct-type system is used in the present invention.

In FIG. 2, the color conversion sheet 40 is arranged on the light source unit 30. The configuration of the color conversion sheet will be described later. The optical sheet group 50 is arranged on the color conversion sheet 40. A prism sheet, a diffusion sheet, etc., are used for the optical sheet group 50. A polarized reflection sheet may be used to improve the use efficiency of the light from the backlight 20. Specific kinds and the numbers of optical sheets to be used are determined according to the display apparatus.

Figure 3:
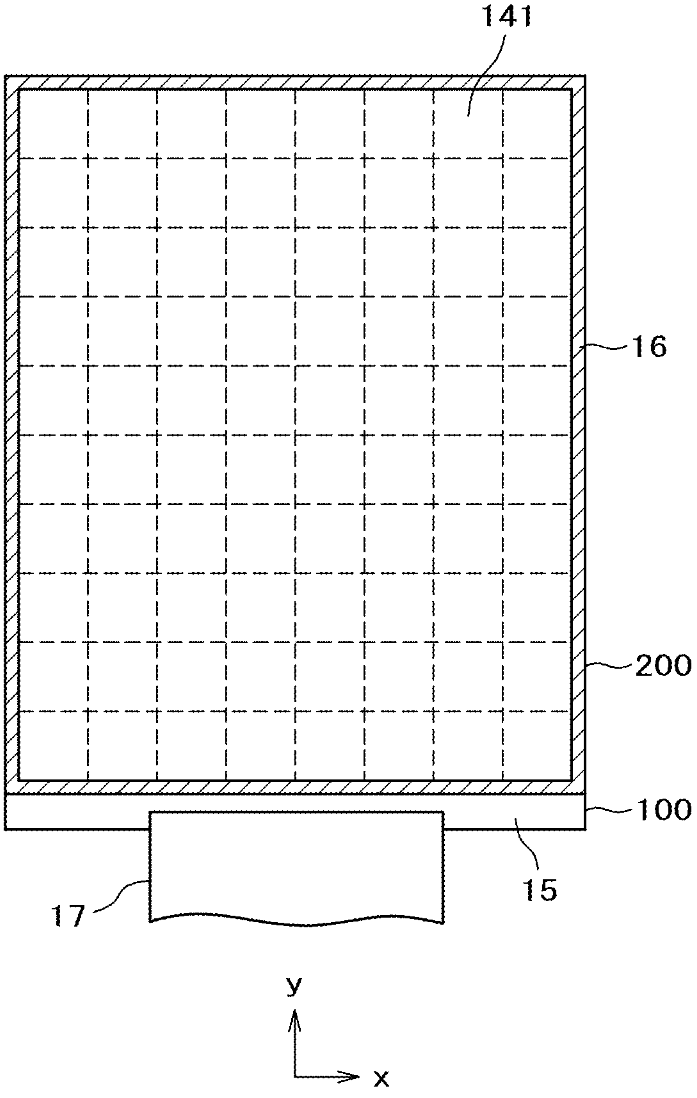
FIG. 3 is a plan view illustrating an example of segments in the liquid crystal display apparatus.

FIG. 3 is a plan view of a case in which the display region of the liquid crystal display panel is divided into segments 141. An LED is arranged for each segment 141 in the backlight. FIG. 3 is a schematic view, and the display region is, in reality, divided into a larger number of segments than in FIG. 3. The size of each segment is equal to or smaller than 4 mm and is approximately 2 mm in many cases. Dotted lines indicating the segments in FIG. 3 are virtual lines, and there are no such lines in the display region.

In FIG. 3, the LED as a light source is arranged at the center of each segment. More specifically, the LEDs are arranged in a matrix on the circuit board, at equal intervals in the x direction and the y direction in plan view. In other words, the LEDs are arranged at vertices of squares.

Figure 4:
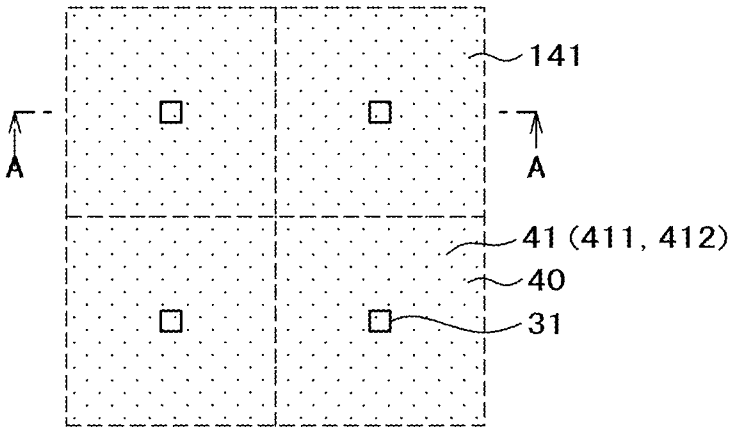
FIG. 4 is a plan view illustrating four segments in a backlight.

FIG. 4 is a plan view depicting four of the segments 141 illustrated in FIG. 3. In FIG. 4, an LED 31 is arranged at the center of the segment 141. It can be stated that the LED 31 is arranged at the vertex of the square as illustrated in FIG. 4. The size of the LED 31 is approximately 100 to 300 μm when a mini LED is used. Although the LED 31 is a square in FIG. 4, the LED 31 may be a rectangle other than the square. The intervals of the LEDs 31 are 2 mm which is the same size as the segments.

The color conversion sheet 40 is arranged to cover the LEDs 31. One piece of color conversion sheet 40 is used in common for the display region. Dotted lines in FIG. 4 are virtual lines indicating boundaries of the segments 141. QDs 41 including a mixture of red QDs 411 and green QDs 412 are dispersed in the color conversion sheet 40 as described in FIG. 5.

Figure 5:
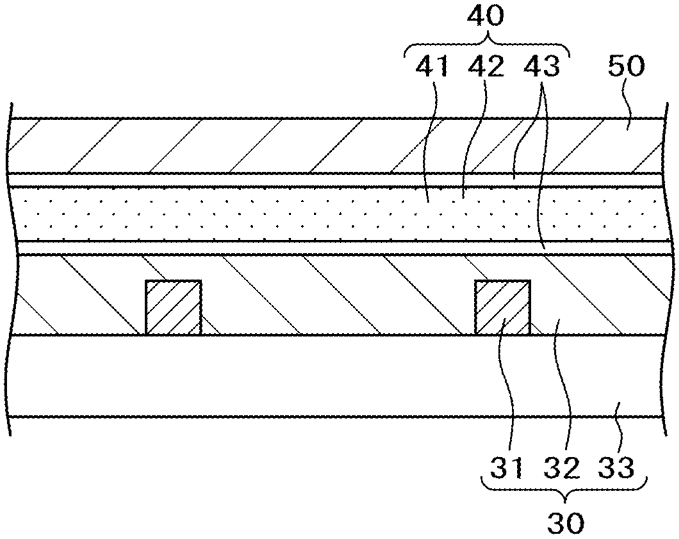
FIG. 5 is a cross-sectional view taken along A-A of FIG. 4.

FIG. 5 is a cross-sectional view illustrating a configuration of the backlight, and FIG. 5 corresponds to a cross-sectional view taken along A-A of FIG. 4. In FIG. 5, the LED 31 is placed on a backlight circuit board 33. A blue light emitting diode (hereinafter, also referred to as a blue LED) is used for the LED 31. The LED 31 is covered by a transparent resin 32. Examples of the transparent resin 32 include an acrylic resin and a silicone resin.

In FIG. 5, the color conversion sheet 40 is placed on the transparent resin 32 covering the LED 31. A phosphor sheet with dispersed phosphor particles or a QD sheet (hereinafter, also referred to as a quantum dot sheet) with dispersed QDs (hereinafter, also referred to as quantum dots) is used as the color conversion material of the color conversion sheet 40. The QD sheet is used in FIG. 5.

In the color conversion sheet (QD sheet) 40, a transparent binder 42 with dispersed quantum dots 41 is sandwiched by thin transparent resin films 43 which also serve as barrier layers, as illustrated in FIG. 5. An acrylic resin, polycarbonate, polyethylene terephthalate (PET), or the like is used for the thin transparent resin films 43 as barrier layers. The thickness of the color conversion sheet 40 as a whole is 80 to 300 microns.

Figure 6:
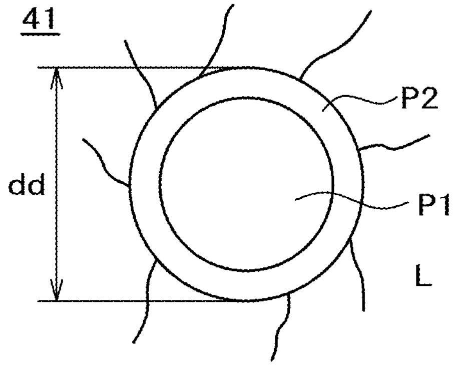
FIG. 6 is an example of a quantum dot.

FIG. 6 is a schematic view of the quantum dot 41 used in FIG. 5. The quantum dot 41 includes semiconductor fine particles, and the wavelength of converted and emitted light varies according to the size of the particle diameter. A diameter dd of the quantum dot 41 is typically equal to or smaller than 20 nm. In FIGS. 6, P1 and P2 represent semiconductors. P1 is, for example, spherical CdSe, and P2 that is ZnS covers the circumference of P1.

The quantum dot 41 confines incident light and emits light of a wavelength longer than that of the incident light. The incident light, which is light from the LED 31, may be blue light or ultraviolet light. In FIG. 5, the light from the LED 31 is blue light. L in the quantum dot 41 of FIG. 6 represents what is generally called a ligand, and the ligand facilitates the dispersion of the quantum dot 41 in the resin. The quantum dot 41 illustrated in FIG. 6 is dispersed in the transparent resin 42 called a binder. Examples of the resin used as the binder 42 include a silicone resin and an epoxy resin.

Figure 7:
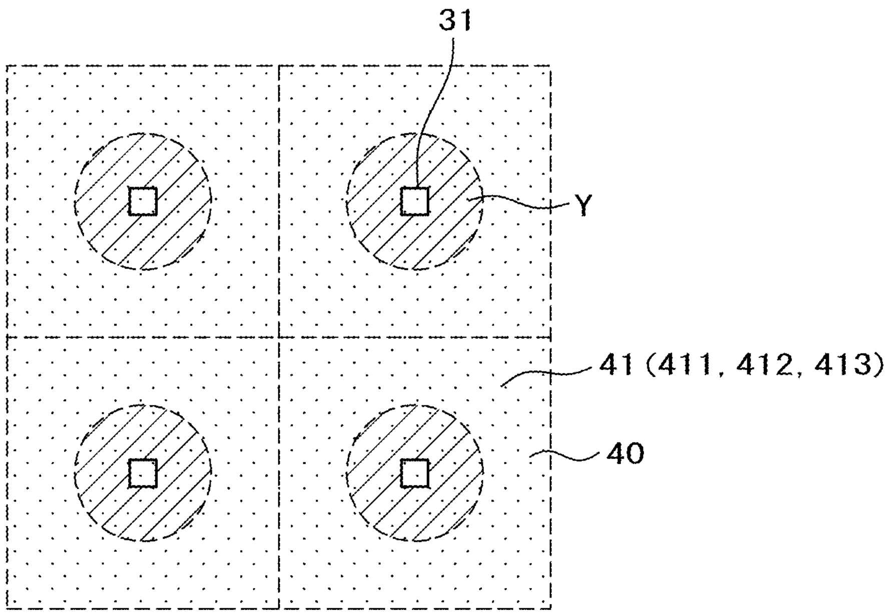
FIG. 7 is a plan view describing a yellow shift.
Figure 8:
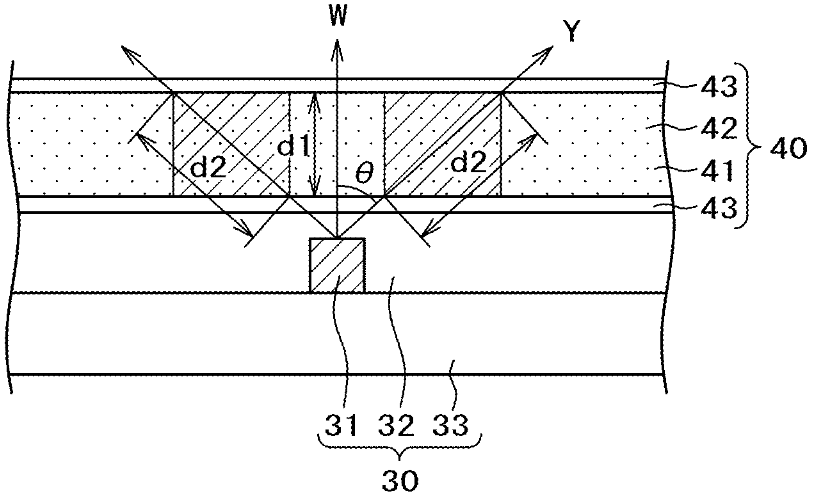
FIG. 8 is a cross-sectional view describing the yellow shift.

FIGS. 7 and 8 depict a problem in the backlight illustrated in FIGS. 4 and 5. FIG. 7 illustrates a pattern of light emission from the color conversion sheet 40 when the LEDs 31 are turned on in the same four segments as in FIG. 4. The configuration of FIG. 7 is the same as that of FIG. 4, and the color conversion sheet 40 is arranged on the LEDs 31. The LEDs 31 emit blue light. Part of the blue light is converted into yellow light by the quantum dots 41, and the rest is output as blue light. Thus, white light is output as a whole.

However, in reality, a yellowish region Y appears around the LED 31 in plan view as illustrated in FIG. 7. The region will hereinafter also be referred to as a yellow shift region. The region has, for example, a hatched circular shape in FIG. 7. FIG. 7 is a schematic view, and the yellow shift region does not have a clear boundary. A circle indicated by a dotted line in FIG. 7 roughly represents a region where the yellow shift occurs. That is, the part corresponding to the LED 31 is white, and the hatched region in FIG. 7 is where the yellow shift has occurred. The outside of the hatch is white again.

FIG. 8 is a cross-sectional view of one segment of the backlight. The optical sheet group is not illustrated in FIG. 8. In FIG. 8, the blue LED 31 is arranged on the circuit board 33, and the transparent resin 32 covers the blue LED 31. The color conversion sheet 40 is arranged on the transparent resin 32. In the color conversion sheet 40, the quantum dots 41 are dispersed in the binder 42, and the binder 42 is sandwiched by the transparent barrier layers 43.

As illustrated in FIG. 8, the distance of the light advancing inside the color conversion sheet 40 varies between the light advancing in the normal direction of the color conversion sheet 40 from the LED 31 and the light advancing at an angle θ from the normal direction. The distance of the light advancing in the normal direction inside the color conversion sheet 40 is d1, and the distance of the light advancing at the angle θ from the normal direction inside the color conversion sheet 40 is d2, where d2>d1.

That is, the light advancing at the angle θ from the normal direction is more likely to be taken up by the quantum dots 41, and thus, the blue light is more likely to be converted into yellow light. This phenomenon varies according to the size of the angle θ, and the phenomenon is conspicuous for human eyes when the angle θ becomes larger than a certain value. On the other hand, the proportions of blue light and yellow light cause the yellow shift, and the amount of blue light and the amount of blue light converted into yellow light become close to each other again when the angle θ becomes even larger. This causes a phenomenon that the emitted light returns to white. That is, of the light advancing from the LED 31 at the angle θ from the normal direction of the color conversion sheet 40, the light at the angle θ in a certain range becomes yellowish.

The present invention is designed to solve the problem. The details of the present invention are described in the following embodiments.

First Embodiment

Figure 9:
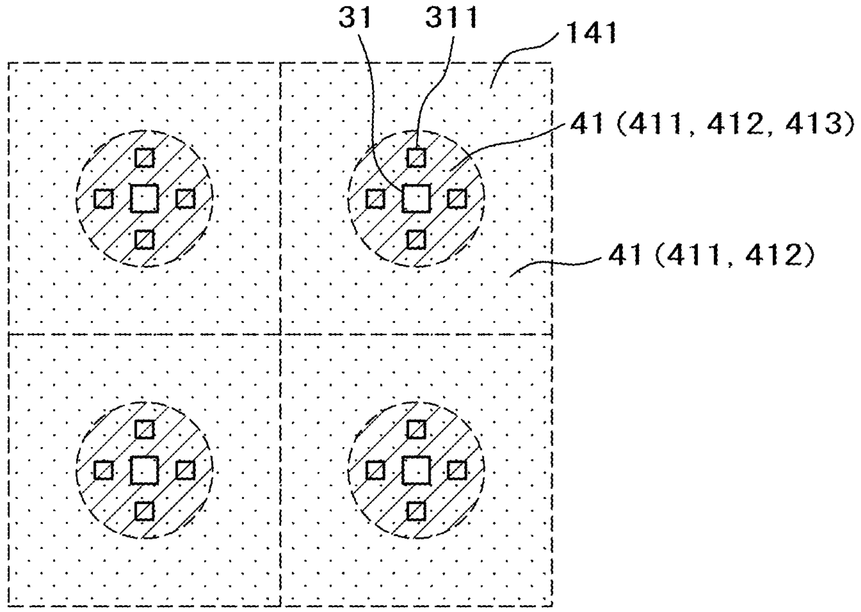
FIG. 9 is a plan view of a first embodiment.

FIG. 9 is a plan view illustrating a feature of a first embodiment. FIG. 9 is a plan view of four segments, corresponding to FIG. 7. In FIG. 9, the blue LED 31 is also positioned at the center of the segment 141, and the color conversion sheet 40 is also arranged to cover the blue LED 31 as in FIG. 7. The red and green quantum dots 41 (411, 412) are dispersed in the color conversion sheet 40. FIG. 9 is different from FIG. 4 or 7 in that blue quantum dots 413 in addition to the red quantum dots 411 and the green quantum dots 412 are dispersed in the region of FIG. 7 where the yellow shift has occurred. In FIG. 9, this part is provided with a reference sign 41 (411, 412, 413) and distinguished from the other part 41 (411, 412). The hatched region 41 (411, 412, 413) in FIG. 9 is formed in a ring shape around the light source 31.

In the light source unit, short-wavelength LEDs 311 that emit light of a shorter wavelength than that of the blue LED 31 are arranged according to the region in which the blue quantum dots 413 are dispersed. The blue light is reinforced by the light from the short-wavelength LEDs 311 through the blue quantum dots 413, and the yellow shift can be cancelled out.

The short-wavelength LEDs 311 are not particularly limited to any kind as long as they are capable of exciting the blue quantum dots 413. For example, purple LEDs or purple light emitting LEDs may be used. The short-wavelength LEDs 311 are simply intended for elimination of the yellow shift, and the amount of light of the short-wavelength LEDs 311 may be smaller than that of the blue LED 31 which is the main light source.

Although the positions of the short-wavelength LEDs 311 may be any positions within the range where the short-wavelength LEDs 311 overlap the quantum dots 41 (411, 412, 413) in FIG. 9, the positions are preferably near the center in the width direction of the region including the quantum dots 41 (411, 412, 413), as illustrated in FIG. 9. In other words, it is desirable that the positions of the short-wavelength LEDs 311 be within a range of d/4 from the blue LED 31, where d represents the intervals of the blue LEDs 31.

Figure 10:
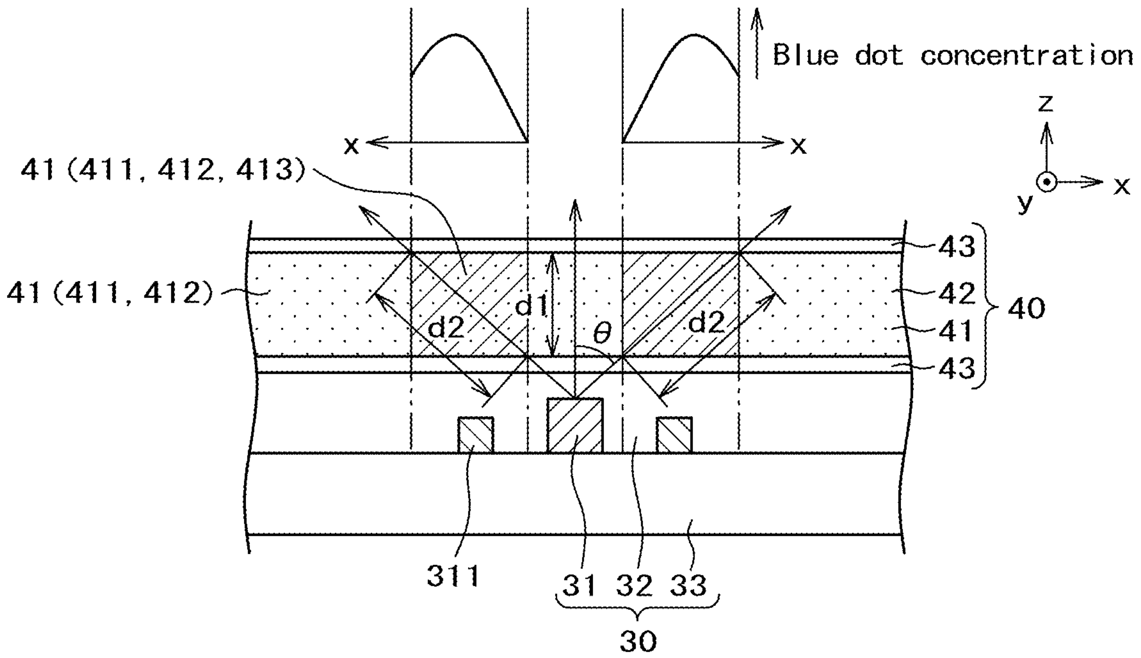
FIG. 10 is a cross-sectional view of the first embodiment.

FIG. 10 is a cross-sectional view of one segment of the backlight corresponding to FIG. 9. The optical sheet group is not illustrated in FIG. 10. In FIG. 10, the quantum dots 41 (411, 412, 413) including the blue quantum dots 413 are dispersed in the hatched region, and the quantum dots 41 (411, 412) are dispersed in the other part.

An upper part of FIG. 10 illustrates an example of a distribution of the blue quantum dots 413. The distribution is a distribution similar to a normal distribution with a peak shifted outside. Yet, this is merely an example, and the objective can also be accomplished by other distributions. That is, the distribution does not have to be accurately controlled as long as the blue quantum dots 413 make the yellow shift inconspicuous. Note that a distribution of the blue quantum dots 413 in a thickness direction (z direction) of the color conversion sheet 40 is not particularly defined in FIG. 10. The distribution of the blue quantum dots 413 in the z direction may be uniform or may have a distribution.

In FIG. 10, the short-wavelength LEDs 311 that emit light of a shorter wavelength than that of the blue LED 31, which is the main light source, are arranged on both sides of the blue LED 31. The short-wavelength LEDs 311 may be any LEDs capable of exciting the blue quantum dots 413 to emit blue light. The size of the mini LED is approximately 100 to 300 μm, and this allows the short-wavelength LEDs 311 to be arranged as in FIG. 10.

In FIG. 9, four short-wavelength LEDs 311 are used around the blue LED 31. FIG. 9 is an example, and the number of short-wavelength LEDs 311 may be reduced in consideration of the cost and the effect. For example, two short-wavelength LEDs 311 may be arranged across the blue LED 31. The effect can also be obtained even by one short-wavelength LED 311. In these cases, it is effective to disperse a large amount of blue quantum dots 413 at parts corresponding to the short-wavelength LEDs 311.

Figure 11:
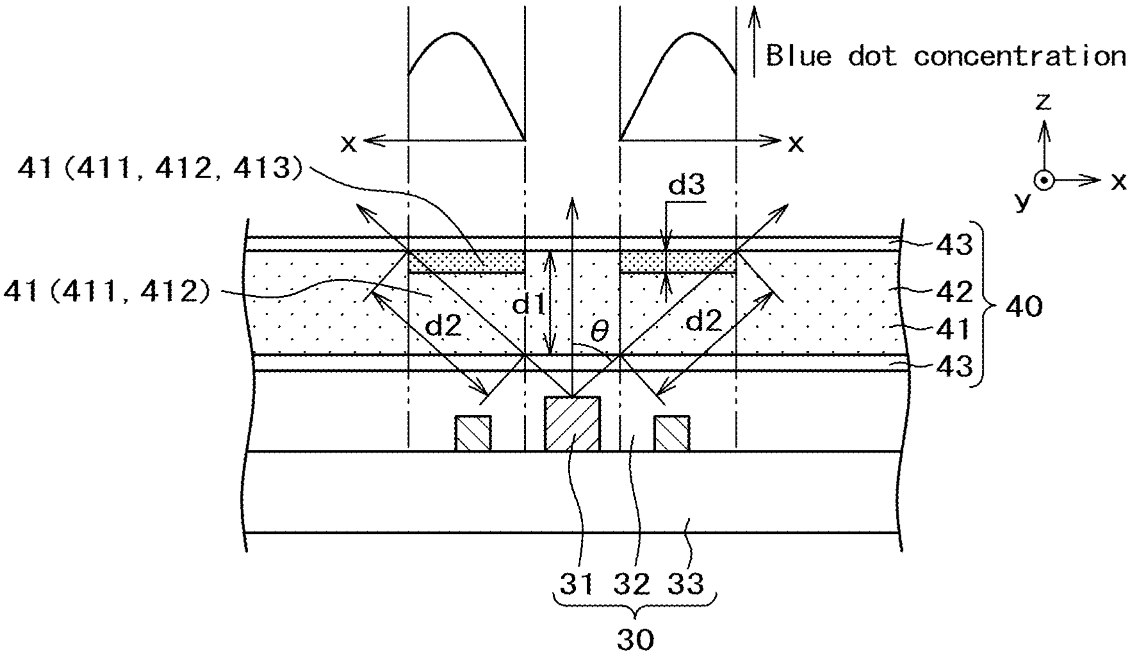
FIG. 11 is a cross-sectional view of another mode of the first embodiment.

FIG. 11 is a cross-sectional view illustrating an example of the distribution of the blue quantum dots 413 in the thickness direction (z direction) in the color conversion sheet 40. In FIG. 11, the blue quantum dots 413 are distributed within a thickness d3 near the upper surface of the color conversion sheet 40. This may be rephrased that the blue quantum dots 413 exist within d1/2 from the upper surface of the color conversion sheet 40, where d1 is the thickness of the part with the quantum dots 41.

It may be difficult in the process to uniformly distribute the blue quantum dots 413 in the thickness direction of the color conversion sheet 40. Meanwhile, the role of the blue quantum dots 413 is to suppress the yellow shift, and the emission of blue light by the blue quantum dots 413 does not have to be that large. Thus, the thickness d3 of the blue quantum dots 413 in the z direction can be smaller than the thickness of the quantum dot 41 (411, 412) layer. In other words, the amount of blue light can also be changed by the thickness d3 of the blue quantum dots 413 in FIG. 11.

A distribution map depicted in an upper part of FIG. 11 illustrates a density distribution of the blue quantum dots 413 in the plane direction (x direction). The density distribution of FIG. 11 is the same as the density distribution of FIG. 10. However, the density distribution in this case is also an example, and the distribution may be other distributions. For example, the thickness d3 of the blue quantum dots 413 is small in FIG. 11, and the distribution in the plane direction (x direction) may be flat.

In any case, the distribution of the blue quantum dots 413 in FIG. 11 is an example. Other than the distribution illustrated in FIG. 11, the distribution may be changed to facilitate controlling the range of the blue quantum dots 413. The other configuration of FIG. 11 is the same as that of FIG. 10.

Second Embodiment

Figure 12:
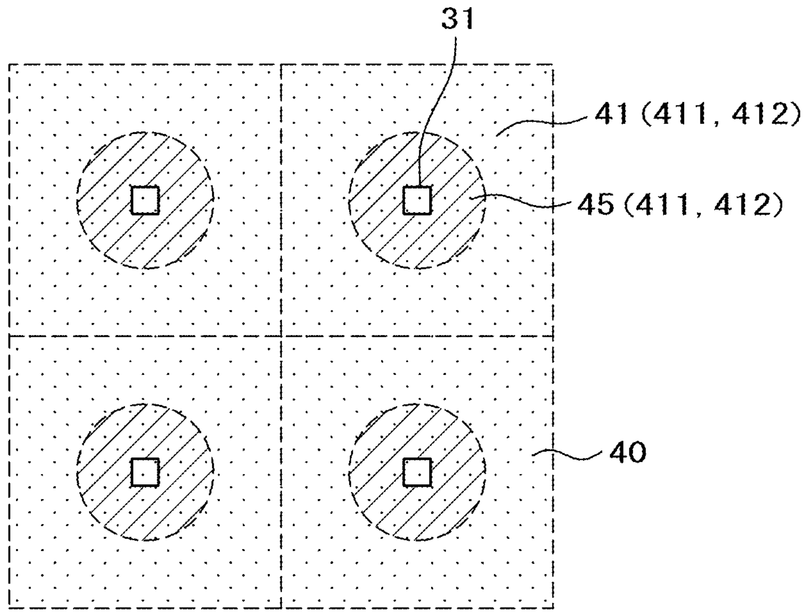
FIG. 12 is a plan view of a second embodiment.

FIG. 12 is a plan view of the color conversion sheet 40 and the light source unit 30 of a second embodiment. In FIG. 12, the blue LED 31 as a light source and the arrangement of the blue LED 31 are the same as those in FIG. 7. However, the configuration of the color conversion sheet 40 is different from that of FIG. 7. The red quantum dots 411 and the green quantum dots 412 are also dispersed in the quantum dots 41 of the color conversion sheet 40 in FIG. 12. The feature of FIG. 12 is that quantum dots 45 (411, 412) are used at the part where the yellow shift illustrated in FIG. 7 has occurred. Although the quantum dots 41 and the quantum dots 45 are the same in that the red quantum dots 411 and the green quantum dots 412 are used, the proportion of the green quantum dots 412 in the quantum dots 45 is larger than that in the quantum dots 41.

When the proportion of the green quantum dots 412 is large, the emitted light shifts to the short-wavelength side from yellow. In other words, the emitted light shifts to the blue wavelength side. As a result, the yellow shift in FIG. 7 is reduced. This method does not require an auxiliary light source unlike in the first embodiment.

Figure 13:
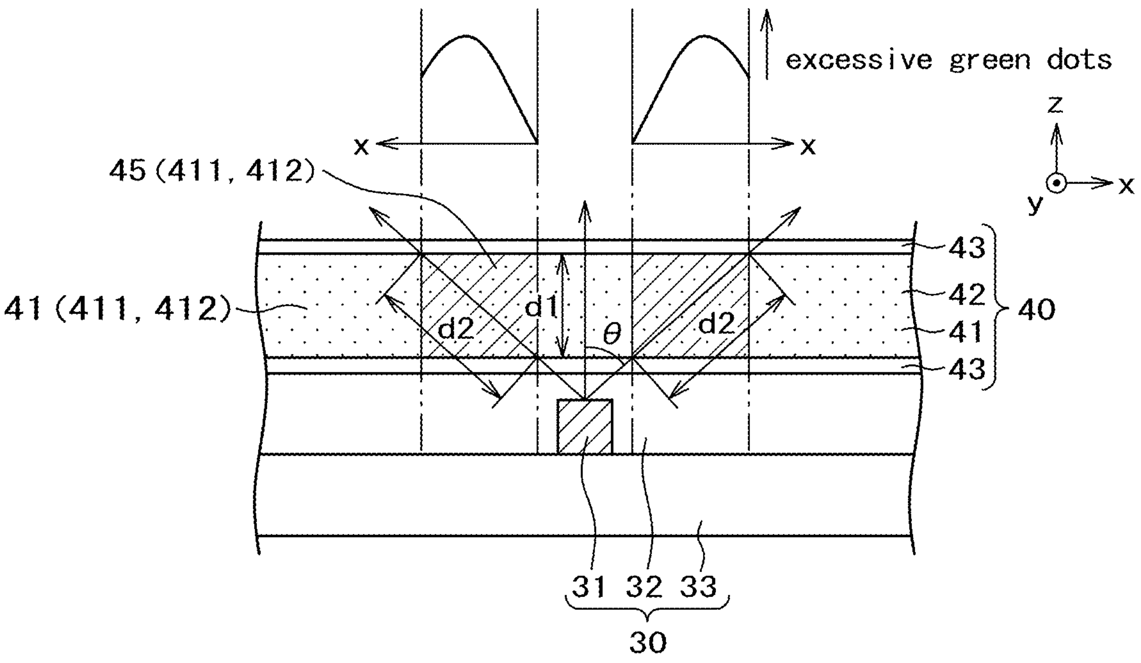
FIG. 13 is a cross-sectional view of the second embodiment.

FIG. 13 is a cross-sectional view illustrating the second embodiment. In the color conversion sheet 40 of FIG. 13, the quantum dots 45 (411, 412) of the hatched part represent the region where the proportion of the green quantum dots 412 is larger than that in the quantum dots 41 (411, 412) of the other part. In the hatched region of FIG. 13, how much the emitted light is to be shifted to the short-wavelength side from yellow can be controlled by the proportions of the green quantum dots 412 and the red quantum dots 411.

The hatched region of FIG. 13 can also be a mixed region of the quantum dots 41 (411, 412) and the quantum dots 45 (411, 412). The proportions of the mixture may be certain proportions or may have a distribution. A distribution map in an upper part of FIG. 13 is a graph illustrating an example of an increase rate of the green quantum dots 412 in the hatched part. The increase rate of the green quantum dots 412 can be changed to accurately correct the yellow shift.

Yet, the distribution illustrated in FIG. 13 is merely an example, and there can be various other distributions. Note that the range where the proportion of the green quantum dots 412 is larger than that in the other part is equal to or smaller than d/4 in radius, where d is the interval of the blue LEDs 31.

As described above, the countermeasure for the yellow shift in the second embodiment can be controlled by the proportions of the green quantum dots 412 and the red quantum dots 411 in the quantum dots 45 (411, 412) in the hatched region of FIG. 13 and can also be controlled by the proportions or distributions of the quantum dots 41 and the quantum dots 45.

Figure 14:
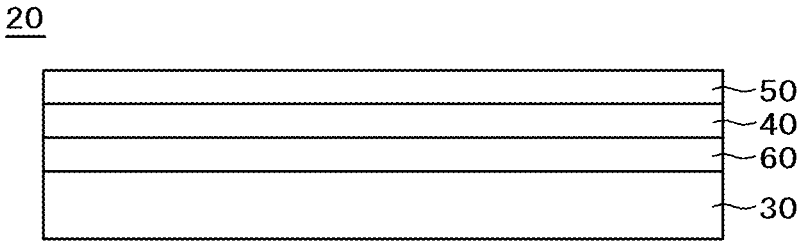
FIG. 14 is a cross-sectional view of another example of the backlight.
Figure 15:
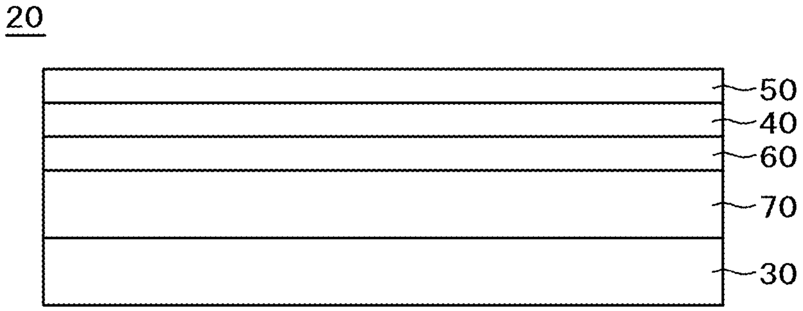
FIG. 15 is a cross-sectional view of yet another example of the backlight.

The configuration of the backlight 20 illustrated in FIG. 2 has been described in the first and second embodiments. However, the present invention can be applied to various backlights other than the backlight illustrated in FIG. 2. A backlight of FIG. 14 is an example in which a dichroic sheet 60 is arranged between the light source unit 30 and the color conversion sheet 40 in addition to the configuration of the backlight of FIG. 2. A backlight of FIG. 15 is an example in which a polycarbonate plate 70 is arranged between the light source unit 30 and the dichroic sheet 60 in addition to the configuration of FIG. 14. The transmittance of the polycarbonate plate 70 is significantly high. Thus, the polycarbonate plate 70 can be used instead of arranging a space between the light source and the dichroic sheet or between the light source and another sheet.

Although the quantum dots 41 are used in the color conversion sheet 40 in the description above, phosphors may be used in the color conversion sheet 40.

What is claimed is:

1. A backlight comprising:
- a light source including blue light emitting diodes arranged in a matrix, on a plane, at first intervals; and
- a color conversion sheet arranged to cover the light source, wherein
- red quantum dots that emit red light in response to blue light and green quantum dots that emit green light in response to blue light are dispersed in the color conversion sheet,
- short-wavelength light emitting diodes that emit light of a shorter wavelength than that of blue light are arranged near the blue light emitting diodes,
- blue quantum dots that emit blue light in response to the short-wavelength light are arranged in the color conversion sheet, at positions overlapping the short-wavelength light emitting diodes in plan view, and
- the blue quantum dots are arranged in a ring shape around the blue light emitting diodes in plan view, and the blue quantum dots do not overlap the blue light emitting diodes.

2. The backlight according to claim 1, wherein
- the blue quantum dots are dispersed along with the red quantum dots and the green quantum dots.

3. The backlight according to claim 1, wherein
the blue quantum dots have a distribution in a plane direction of the color conversion sheet, and a peak of the distribution is outside a center of a width of regions in the ring shape.

4. The backlight according to claim 1, wherein
the blue quantum dots have a distribution in a cross-sectional direction of the color conversion sheet, and a density of the color conversion sheet is larger toward a side away from the light source than a center of the color conversion sheet in the cross-sectional direction.

5. The backlight according to claim 1, wherein
intervals of the short-wavelength light emitting diodes and the blue light emitting diodes are equal to or smaller than ¼ of the first intervals.

6. The backlight according to claim 1, wherein
four of the short-wavelength light emitting diodes are arranged in such a manner as to sandwich a corresponding one of the blue light emitting diodes in plan view.

7. A backlight comprising:
a light source including blue light emitting diodes arranged in a matrix, on a plane, at first intervals; and
a color conversion sheet arranged to cover the light source, wherein
red quantum dots that emit red light in response to blue light and green quantum dots that emit green light in response to blue light are dispersed in the color conversion sheet,
short-wavelength light emitting diodes that emit light of a shorter wavelength than that of blue light are arranged near the blue light emitting diodes,
blue quantum dots that emit blue light in response to the short-wavelength light are arranged in the color conversion sheet, at positions overlapping the short-wavelength light emitting diodes in plan view, and
two of the short-wavelength light emitting diodes are arranged in such a manner as to sandwich a corresponding one of the blue light emitting diode in plan view.

8. A liquid crystal display apparatus comprising:
a backlight on a back surface of a liquid crystal display panel, wherein
the backlight is the backlight according to claim 1.

9. A backlight comprising:
a light source including blue light emitting diodes arranged in a matrix, on a plane, at first intervals; and
a color conversion sheet arranged to cover the light source, wherein
red quantum dots that emit red light in response to blue light and green quantum dots that emit green light in response to blue light are dispersed in the color conversion sheet, and
the color conversion sheet includes regions in a ring shape around the blue light emitting diodes in plan view, where a proportion of the green quantum dots is higher than those in other regions.

10. The backlight according to claim 9, wherein
a width of the regions where the proportion of the green quantum dots is higher than those in the other regions is equal to or smaller than ¼ of the first intervals.

11. A liquid crystal display apparatus comprising:
a backlight on a back surface of a liquid crystal display panel, wherein
the backlight is the backlight according to claim 9.

* * * * *